United States Patent
Sun (10) Patent No.: US 12,155,003 B2
(45) Date of Patent: Nov. 26, 2024

(54) METHOD FOR TRANSFERRING LIGHT-EMITTING DIODE AND LIGHT-EMITTING BASE PLATE

(71) Applicants: Huizhou China Star Optoelectronics Display Co., Ltd., Huizhou (CN); Shenzhen China Star Optoelectronics Semiconductor Display Technology Co., Ltd., Shenzhen (CN)

(72) Inventor: Bo Sun, Huizhou (CN)

(73) Assignees: Huizhou China Star Optoelectronics Display Co., Ltd., Huizhou (CN); Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 0 days.

(21) Appl. No.: 17/621,643

(22) PCT Filed: Nov. 30, 2021

(86) PCT No.: PCT/CN2021/134491
§ 371 (c)(1),
(2) Date: Dec. 21, 2021

(87) PCT Pub. No.: WO2023/087394
PCT Pub. Date: May 25, 2023

(65) Prior Publication Data
US 2024/0055548 A1  Feb. 15, 2024

(30) Foreign Application Priority Data
Nov. 22, 2021  (CN) .......................... 202111382884.8

(51) Int. Cl.
*H01L 21/66* (2006.01)
*H01L 27/15* (2006.01)
*H01L 33/00* (2010.01)

(52) U.S. Cl.
CPC ............ *H01L 33/005* (2013.01); *H01L 22/14* (2013.01); *H01L 22/32* (2013.01); *H01L 27/156* (2013.01); *H01L 2933/0066* (2013.01)

(58) Field of Classification Search
None
See application file for complete search history.

(56) References Cited

U.S. PATENT DOCUMENTS

2019/0319165 A1\* 10/2019 Zou ........................ H01L 24/83
2021/0005588 A1  1/2021 Chung
2021/0335752 A1  10/2021 Huang

FOREIGN PATENT DOCUMENTS

CN   109473532 A   3/2019
CN   109661122 A   4/2019
(Continued)

OTHER PUBLICATIONS

International Search Report in International application No. PCT/CN2021/134491, mailed on Jun. 24, 2022.
(Continued)

*Primary Examiner* — Asok K Sarkar
(74) *Attorney, Agent, or Firm* — PV IP PC; Wei Te Chung (57) ABSTRACT

A method for transferring a light-emitting diode (LED) and a light-emitting base plate are disclosed. The method for transferring an LED includes: providing a target base plate and a transfer base plate, wherein the target base plate includes a target substrate and a plurality of pad sets disposed on the target substrate, and the transfer base plate includes a transfer substrate and a blue film disposed on the transfer substrate, wherein a plurality of to-be-transferred LEDs are connected to the blue film; connecting the to-be-transferred LEDs to the pad sets in alignment; energizing the plurality of to-be-transferred LEDs to separate the blue film
(Continued)

from the to-be-transferred LEDs; and removing the transfer base plate.

20 Claims, 7 Drawing Sheets

(56) References Cited

FOREIGN PATENT DOCUMENTS

| CN | 110335844 A | 10/2019 |
|---|---|---|
| CN | 113345829 A | 9/2021 |

OTHER PUBLICATIONS

Written Opinion of the International Search Authority in International application No. PCT/CN2021/134491, mailed on Jun. 24, 2022.
Chinese Office Action issued in corresponding Chinese Patent Application No. 202111382884.8 dated Jan. 21, 2024, pp. 1-7.

* cited by examiner

METHOD FOR TRANSFERRING LIGHT-EMITTING DIODE AND LIGHT-EMITTING BASE PLATE

CROSS-REFERENCE TO RELATED APPLICATION

This application is a national phase application under 35 U.S.C. § 371 of PCT Application No. PCT/CN2021/134491, filed Nov. 30, 2021, which claims priority to Chinese Application No. 202111382884.8, filed Nov. 22, 2021, the contents of which are incorporated herein by reference in their entirety.

FIELD OF INVENTION

The present disclosure relates to the field of display technologies, and in particular, to a method for transferring a light-emitting diode (LED) and a light-emitting base plate.

BACKGROUND OF INVENTION

The mini light-emitting diode (mini-LED) and the micro light-emitting diode (micro-LED) are widely regarded as the next-generation display technology following the liquid crystal display, which, however, currently encounter some technological difficulties. For example, a driving circuit is unstable, mass transfer is difficult, and a transfer yield is low.

Technical Problem

In a mass LED transfer process, a plurality of transfer technologies are currently available for a mass transfer technology route of transferring LEDs to a blue film from an epitaxial growth substrate, arrange the chips on the blue film according to an RGB pixel arrangement scheme, and then transferring the LEDs to a target base plate. A laser transfer technology has a low transfer rate, for example, when used for a current mainstream 8K display. The display has hundred million sub-pixels, and even the most efficient infrared laser transfer technology can transfer only about 10 million LEDs per hour. In addition, since the LEDs are irradiated by the high-energy laser during transfer by the laser, the performance of the LEDs may degrade. The transfer technology using a traditional die bonder and a needle die bonder has limited transfer accuracy and rate, failing to satisfy the requirements of the mass transfer of the LEDs. In addition, the seal transfer method has disadvantages, such as high material costs for polydimethylsiloxane (PDMS) and high arrangement costs.

Therefore, it is of great significance to provide a new feasible LED mass transfer solution.

SUMMARY OF INVENTION

Technical Solution

Embodiments of the present disclosure provide a method for transferring a light-emitting diode (LED) and a light-emitting base plate.

An embodiment of the present disclosure provides a method for transferring an LED, including steps of:
providing a target base plate and a transfer base plate, wherein the target base plate includes a target substrate and a plurality of pad sets disposed on the target substrate, and the transfer base plate includes a transfer substrate and a blue film disposed on the transfer substrate, wherein a plurality of to-be-transferred LEDs are connected to the blue film;
connecting the to-be-transferred LEDs to the pad sets in alignment;
energizing the plurality of to-be-transferred LEDs to separate the blue film from the to-be-transferred LEDs; and
removing the transfer base plate.

Optionally, in some embodiments of the present disclosure, the target base plate further includes a conductive circuit disposed on the target substrate and connected to the pad sets. The step of energizing the plurality of to-be-transferred LEDs includes:
applying a voltage to the conductive circuit, to cause the LEDs to emit light.

Optionally, in some embodiments of the present disclosure, the conductive circuit includes test pads and test traces. The test pads are located in a peripheral area of the target substrate. The pad sets are connected to the test pads using the test traces. The step of applying the voltage to the conductive circuit includes: applying a voltage to the test pads.

Optionally, in some embodiments of the present disclosure, the to-be-transferred LEDs include a to-be-transferred red LED, a to-be-transferred green LED, and a to-be-transferred blue LED, the pad sets include a first pad set, a second pad set, and a third pad set, the test pads include a first test pad, a second test pad, and a third test pad, and the test traces include a first test trace, a second test trace, and a third test trace. The first pad set is connected to the first test pad using the first test trace, the second pad set is connected to the second test pad using the second test trace, and the third pad set is connected to the third test pad using the third test trace.

The step of connecting the to-be-transferred LEDs to the pad sets in alignment includes: connecting the to-be-transferred red LED to the first pad set in alignment, connecting the to-be-transferred green LED to the second pad set in alignment, and connecting the to-be-transferred blue LED to the third pad set in alignment.

The step of applying the voltage to the test pads includes: applying a same voltage to the first test pad, the second test pad, and the third test pad to separate the blue film from the to-be-transferred red LED, the to-be-transferred green LED, and the to-be-transferred blue LED.

Optionally, in some embodiments of the present disclosure, the to-be-transferred LEDs include a to-be-transferred red LED, a to-be-transferred green LED, and a to-be-transferred blue LED, the pad sets include a first pad set, a second pad set, and a third pad set, the test pads include a first test pad, a second test pad, and a third test pad, and the test traces include a first test trace, a second test trace, and a third test trace. The first pad set is connected to the first test pad using the first test trace, the second pad set is connected to the second test pad using the second test trace, and the third pad set is connected to the third test pad using the third test trace.

The step of connecting the to-be-transferred LEDs to the pad sets in alignment includes: connecting the to-be-transferred red LED to the first pad set in alignment, connecting the to-be-transferred green LED to the second pad set in alignment, and connecting the to-be-transferred blue LED to the third pad set in alignment.

The step of applying the voltage to the test pads includes: applying a first voltage $V1$ to the first test pad, applying a second voltage $V2$ to the second test pad, and applying a third voltage $V3$ to the third test pad, wherein $V1<V2<V3$.

Optionally, in some embodiments of the present disclosure, the step of removing the transfer base plate includes moving the transfer base plate in a direction perpendicular to a plane where the target base plate is located.

Optionally, in some embodiments of the present disclosure, after the plurality of to-be-transferred LEDs are energized, the lighted to-be-transferred LEDs are separated from the blue film.

The step of removing the transfer base plate includes: removing the transfer base plate including the transfer substrate and the blue film.

Optionally, in some embodiments of the present disclosure, after the plurality of to-be-transferred LEDs are energized, the lighted to-be-transferred LEDs are separated from the blue film, and the lightless to-be-transferred LEDs are connected to the blue film.

The step of removing the transfer base plate includes: removing the transfer base plate including the transfer substrate, the blue film, and the lightless to-be-transferred LEDs.

Optionally, in some embodiments of the present disclosure, in the step of providing the transfer base plate and the target base plate, conductive contacts are connected to the to-be-transferred LEDs.

After the step of removing the transfer base plate, the method further includes: welding the conductive contacts to the corresponding pad sets.

An embodiment of the present disclosure further provides a method for transferring an LED, including steps of:
  providing a target base plate and a transfer base plate, wherein the target base plate includes a target substrate and a plurality of pad sets disposed on the target substrate, and the transfer base plate includes a transfer substrate and a blue film disposed on the transfer substrate, wherein a plurality of to-be-transferred LEDs are connected to the blue film, and conductive contacts are connected to the to-be-transferred LEDs;
  connecting the to-be-transferred LEDs to the pad sets in alignment;
  energizing the plurality of to-be-transferred LEDs to separate the blue film from the to-be-transferred LEDs; and
  moving the transfer base plate in a direction perpendicular to a plane where the target base plate is located; and
  welding the conductive contacts to the corresponding pad sets.

Optionally, in some embodiments of the present disclosure, the target base plate further includes a conductive circuit disposed on the target substrate and connected to the pad sets.

The step of energizing the plurality of to-be-transferred LEDs includes:
  applying a voltage to the conductive circuit, to cause the LEDs to emit light.

Optionally, in some embodiments of the present disclosure, the conductive circuit includes test pads and test traces. The test pads are located in a peripheral area of the target substrate. The pad sets are connected to the test pads using the test traces.

The step of applying the voltage to the conductive circuit includes:
  applying a voltage to the test pads.

Optionally, in some embodiments of the present disclosure, the to-be-transferred LEDs include a to-be-transferred red LED, a to-be-transferred green LED, and a to-be-transferred blue LED.

The pad sets include a first pad set, a second pad set, and a third pad set, the test pads include a first test pad, a second test pad, and a third test pad, and the test traces include a first test trace, a second test trace, and a third test trace. The first pad set is connected to the first test pad using the first test trace, the second pad set is connected to the second test pad using the second test trace, and the third pad set is connected to the third test pad using the third test trace.

The step of connecting the to-be-transferred LEDs to the pad sets in alignment includes:
  connecting the to-be-transferred red LED to the first pad set in alignment, connecting the to-be-transferred green LED to the second pad set in alignment, and connecting the to-be-transferred blue LED to the third pad set in alignment.

The step of applying the voltage to the test pads includes:
  applying a same voltage to the first test pad, the second test pad, and the third test pad to separate the blue film from the to-be-transferred red LED, the to-be-transferred green LED, and the to-be-transferred blue LED.

Optionally, in some embodiments of the present disclosure, the to-be-transferred LEDs include a to-be-transferred red LED, a to-be-transferred green LED, and a to-be-transferred blue LED.

The pad sets include a first pad set, a second pad set, and a third pad set, the test pads include a first test pad, a second test pad, and a third test pad, and the test traces include a first test trace, a second test trace, and a third test trace. The first pad set is connected to the first test pad using the first test trace, the second pad set is connected to the second test pad using the second test trace, and the third pad set is connected to the third test pad using the third test trace.

The step of connecting the to-be-transferred LEDs to the pad sets in alignment includes:
  connecting the to-be-transferred red LED to the first pad set in alignment, connecting the to-be-transferred green LED to the second pad set in alignment, and connecting the to-be-transferred blue LED to the third pad set in alignment.

The step of applying the voltage to the test pads includes:
  applying a first voltage $V1$ to the first test pad, applying a second voltage $V2$ to the second test pad, and applying a third voltage $V3$ to the third test pad, wherein $V1<V2<V3$.

Optionally, in some embodiments of the present disclosure, after the plurality of to-be-transferred LEDs are energized, the lighted to-be-transferred LEDs are separated from the blue film.

The step of removing the transfer base plate includes:
  removing the transfer base plate including the transfer substrate and the blue film.

Optionally, in some embodiments of the present disclosure, after the plurality of to-be-transferred LEDs are energized, the lighted to-be-transferred LEDs are separated from the blue film, and the lightless to-be-transferred LEDs are connected to the blue film.

The step of removing the transfer base plate includes:
  removing the transferring base plate including the transferring substrate, the blue film, and the lightless to-be-transferred LEDs.

An embodiment of the present disclosure provides a light-emitting base plate, including:
  a target base plate including a target substrate and a plurality of pad sets disposed on the target substrate; and
  a plurality of light-emitting diodes (LEDs) connected to the plurality of pad sets in a one-to-one correspondence. The LEDs are obtained using the method for transferring an LED described in any of the above embodiments.

Beneficial Effects

In the method for transferring an LED of the present disclosure, after the to-be-transferred LEDs are connected in alignment to the pad sets, the to-be-transferred LEDs are energized. In the energized state, the LEDs emit light, and a thermal effect occurs. When the thermal effect is transmitted to the blue film, temperatures at positions where the blue film is in contact with the to-be-transferred LEDs increase, and continuously increases with the continuous heating, until the glue in the blue film denatures and loses viscosity. In this case, the acting force between the to-be-transferred LEDs and the blue film disappears and the to-be-transferred LEDs are separated from the blue film. Therefore, after the transfer base plate is removed, the to-be-transferred LEDs are directly separated from the blue film, thereby completing the transfer of the LEDs.

BRIEF DESCRIPTION OF DRAWINGS

To describe the technical solutions of the embodiments of the present disclosure more clearly, the following briefly introduces the accompanying drawings required for describing the embodiments. The accompanying drawings described below show only some embodiments of the present disclosure, and a person skilled in the art may still derive other drawings from these accompanying drawings without creative efforts.

DETAILED DESCRIPTION OF PREFERRED EMBODIMENTS

The following clearly and completely describes the technical solutions in the embodiments of the present disclosure with reference to the accompanying drawings in the embodiments of the present disclosure. Apparently, the described embodiments are only some of the embodiments of the present disclosure rather than all of the embodiments. All other embodiments obtained by a person skilled in the art based on the embodiments of the present disclosure without creative efforts shall fall within the protection scope of the present disclosure. In addition, it is to be understood that the specific implementations described herein are only used to describe and explain the present disclosure, but are not intended to limit the present disclosure. In the present disclosure, without the contrary explanation, the directional terms such as "above" and "below" usually refers to "above" and "below" in actual use or a working state of a device, and specifically refer to drawing directions of the corresponding accompanying drawings; and "inside" and "outside" are relative to the contour of the device.

The present disclosure provides a method for transferring a light-emitting diode (LED) and a light-emitting base plate. Respective detailed descriptions are provided below. It is to be noted that, a description order of the following embodiments is not construed as a limitation on a preferred order of the embodiments.

Figure 1:
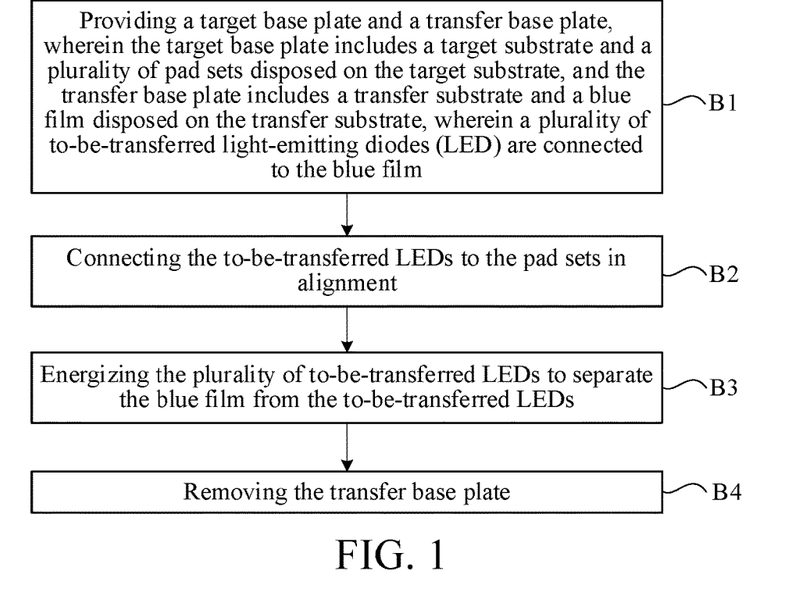
FIG. 1 is a schematic flowchart of a method for transferring a light-emitting diode (LED) according to the present disclosure.

Referring to FIG. 1, the present disclosure provides a method for transferring an LED. The method includes steps of:

B1: Providing a target base plate and a transfer base plate, wherein the target base plate includes a target substrate and a plurality of pad sets disposed on the target substrate, and the transfer base plate includes a transfer substrate and a blue film disposed on the transfer substrate, wherein a plurality of to-be-transferred LEDs are connected to the blue film.

B2: Connecting the to-be-transferred LEDs to the pad sets in alignment.

B3: Energizing the plurality of to-be-transferred LEDs to separate the blue film from the to-be-transferred LEDs.

B4: Removing the transfer base plate.

In the method for transferring an LED of the present disclosure, after the to-be-transferred LEDs are connected in alignment to the pad sets, the to-be-transferred LEDs are energized. In the energized state, the LEDs emit light, and a thermal effect occurs. When the thermal effect is transmitted to the blue film, temperatures at positions where the blue film is in contact with the to-be-transferred LEDs increase, and continuously increases with the continuous heating, until the glue in the blue film denatures and loses viscosity. In this case, the acting force between the to-be-transferred LEDs and the blue film disappears and the to-be-transferred LEDs are separated from the blue film. Therefore, after the transfer base plate is removed, the to-be-transferred LEDs are directly separated from the blue film, thereby completing the transfer of the LEDs.

The method for transferring an LED provided in the present disclosure is described in detail below with reference to detailed embodiments.

Figure 2A:
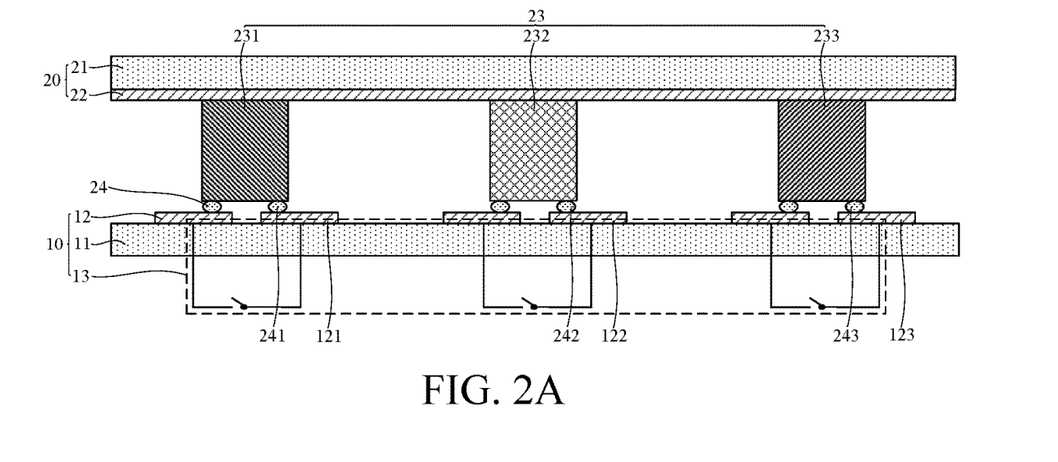
FIGS. 2A to 2E are schematic diagrams of structures corresponding to steps of the method for transferring an LED shown in FIG. 1.

Referring to FIG. 1, FIGS. 2A to 2E, and FIGS. 3 and 4 together, a first embodiment of the present disclosure provides a method for transferring an LED. The method includes steps of:

B1: Providing a target base plate 10 and a transfer base plate 20, wherein the target base plate 10 includes a target substrate 11 and a plurality of pad sets 12 disposed on the target substrate 11, and the transfer base plate 20 includes a transfer substrate 21 and a blue film 22 disposed on the transfer substrate 21, wherein a plurality of to-be-transferred LEDs 23 are connected to the blue film 22, as shown in FIG. 2A.

The target substrate 11 may be a driving base plate. The driving base plate includes thin film transistors (not shown in the figure) configured to drive the LEDs 23 to emit light. The related arts are all the prior art, and are not described in detail herein.

The pad sets 12 are formed in a process for manufacturing the target substrate 11. Each of the pad sets 12 includes a positive polarity pad and a negative polarity pad (not marked in the figure). The positive polarity pad is configured to be connected to a positive pole of the LEDs 23. The negative polarity pad is configured to be connected to a negative pole of the LEDs 23. In the present embodiment, the pad sets 12 include a first pad set 121, a second pad set 122, and a third pad set 123.

The transfer base plate 20 is an intermediate carrier during the transfer of the LEDs 23. The transfer substrate 21 may be a sapphire substrate, a gallium arsenide substrate, a silicon substrate, or quartz glass.

The to-be-transferred LEDs 23 may be mini-LEDs or micro-LEDs. The to-be-transferred LEDs 23 include a to-be-transferred red LED 231, a to-be-transferred green LED 232, and a to-be-transferred blue LED 233. The to-be-transferred red LED 231 corresponds to the first pad set 121. The to-be-transferred green LED 232 corresponds to the second pad set 122. The to-be-transferred blue LED 233 corresponds to the third pad set 123.

Conductive contacts 24 are connected to the to-be-transferred LEDs 23. A material of each conductive contact 24 may include one or more of metals having a low melting point, such as tin, indium, lead, or bismuth. The conductive contacts 24 include a first conductive contact 241, a second conductive contact 242, and a third conductive contact 243. The first conductive contact 241 is connected to the to-be-transferred red LED 231. The second conductive contact 242 is connected to the to-be-transferred green LED 232. The third conductive contact 243 is connected to the to-be-transferred blue LED 233.

In the present embodiment, the target base plate 10 further includes a conductive circuit 13 disposed on the target substrate 11. The conductive circuit 13 is connected to the pad sets 12. The conductive circuit 13 is configured to be connected to an external power supply to input a voltage to the pad sets 12. The conductive circuit 13 is disconnected from the external power supply.

Figure 3:
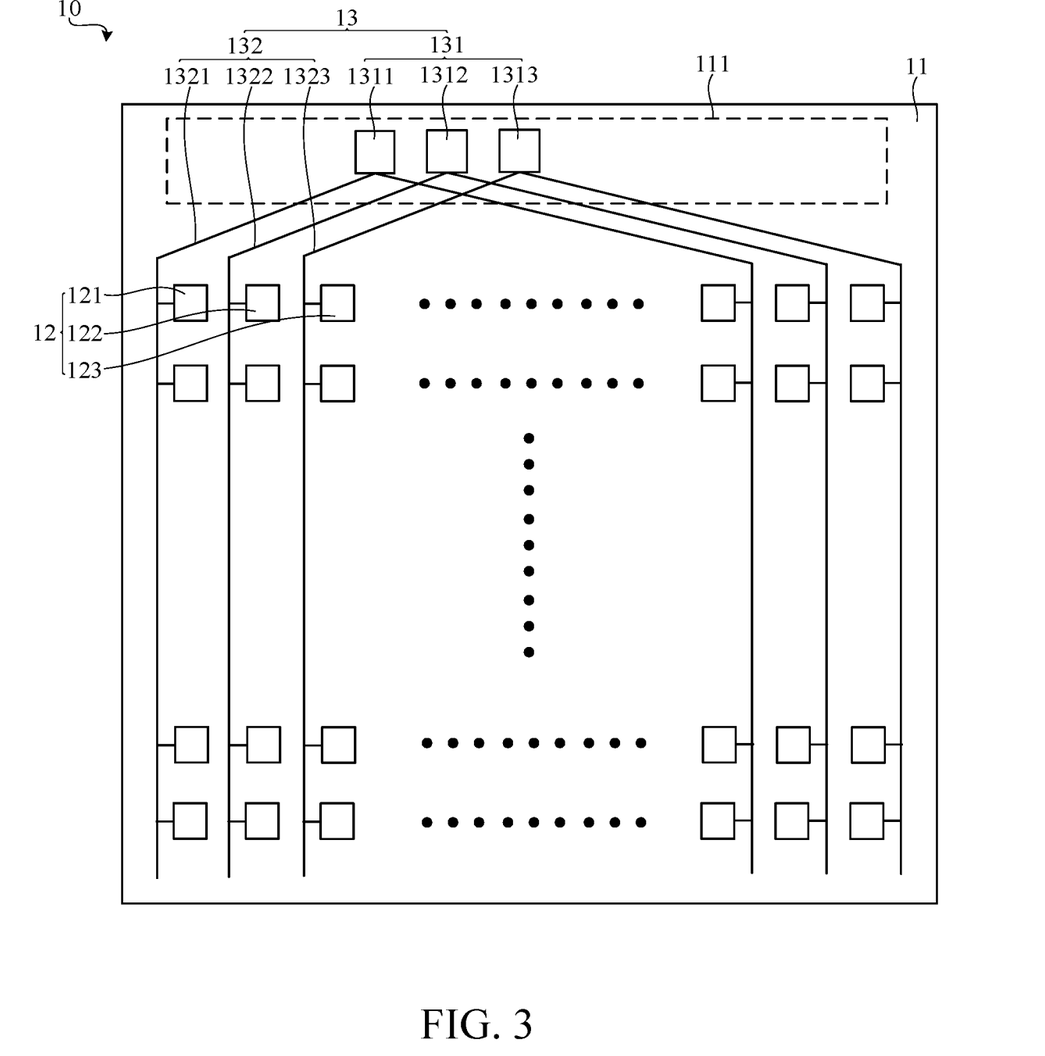
FIG. 3 is a schematic top view of a target base plate in step B1 of the method for transferring an LED shown in FIG. 1.

Referring to FIGS. 2A and 3, in the present embodiment, the conductive circuit 13 includes test pads 131 and test traces 132. The test pads 131 are located in a peripheral area 111 of the target substrate 11. The pad sets 12 are connected to the test pads 131 using the test traces 132.

The test pads 131 and the test traces 132 may be original test circuits in the target base plate 10, or may be additionally added conductive circuits for energizing the to-be-transferred LEDs 23 during subsequent transfer. In the present embodiment, the test pads 131 and the test traces 132 are the original test circuits in the target base plate 10. In this way, a new manufacturing process can be avoided. The conductive circuit 13 required for the present embodiment can be formed based on the original process. Therefore, the process cost can be reduced.

In detail, the test pads 131 include a first test pad 1311, a second test pad 1312, and a third test pad 1313. The test traces 132 include a first test trace 1321, a second test trace 1322, and a third test trace 1323. The first pad set 121 is connected to the first test pad 1311 using the first test trace 1321. The second pad set 122 is connected to the second test pad 1312 using the second test trace 1322. The third pad set 123 is connected to the third test pad 1313 using the third test trace 1323.

The target substrate 11 has a plurality of first test traces 1321, a plurality of second test trace 1322, and a plurality of third test trace 1323. The plurality of first test traces 1321 are connected to one first test pad 1311. The plurality of second test traces 1322 are connected to one second test pad 1312. The plurality of third test traces 1323 are connected to one third test pad 1313.

B2: Connecting the to-be-transferred LEDs 23 to the pad sets 12 in alignment.

At least one of the target base plate 10 or the transfer base plate 20 is moved to connect the to-be-transferred LEDs 23 to the corresponding pad sets 12 in alignment. The connection between the to-be-transferred LEDs 23 and the corresponding pad sets 12 means contact between the to-be-transferred LEDs 23 and the pad sets 12 to achieve conduction.

Still referring to FIG. 2A, in detail, the to-be-transferred red LED 231 is connected in alignment to the first pad set 121, the to-be-transferred green LED 232 is connected in alignment to the second pad set 122, and the to-be-transferred blue LED 233 is connected in alignment to the third pad set 123.

Figure 2B:
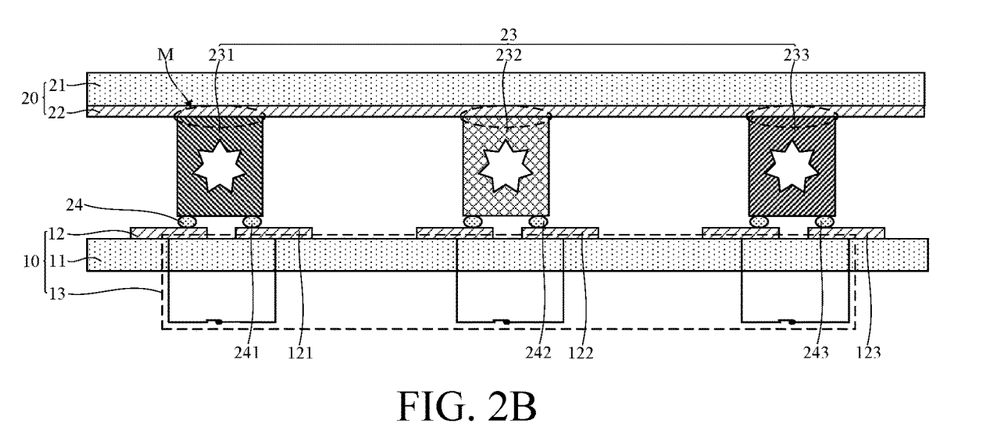

B3: Energizing the plurality of to-be-transferred LEDs 23 to separate the blue film 22 from the to-be-transferred LEDs 23.

Figure 2C:
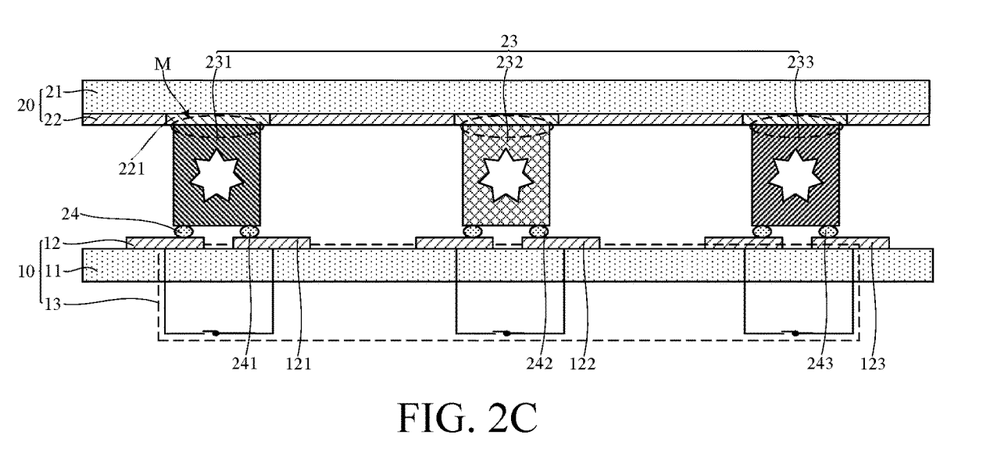

The external power supply applies a voltage to the conductive circuit 13. The voltage in the conductive circuit 13 is transmitted to the pad sets 12 to cause the to-be-transferred LEDs 23 to emit light. The to-be-transferred LEDs 23 generate a thermal effect in the lighted state. Therefore, when the thermal effect is conducted to the blue film 22, temperatures at positions M where the blue film 22 is in contact with the to-be-transferred LEDs 23 increase, as shown in FIG. 2B. The voltage is continuously applied to the conductive circuit 13. With the continuous heating, the temperature at the positions M where the blue film 22 is in contact with the lighted to-be-transferred LEDs 23 continuously increase, until glue in the blue film 22 denatures and loses viscosity, as shown in FIG. 2C. In this case, an acting force between the to-be-transferred LEDs 23 and the blue film 22 is eliminated, and a portion 221 where the blue film 22 is contact with the to-be-transferred LEDs 23 loses the viscosity. Therefore, the blue film is separated from the to-be-transferred LEDs 23.

The step of applying the voltage to the conductive circuit 13 includes applying a voltage to the test pads 131.

Figure 4:
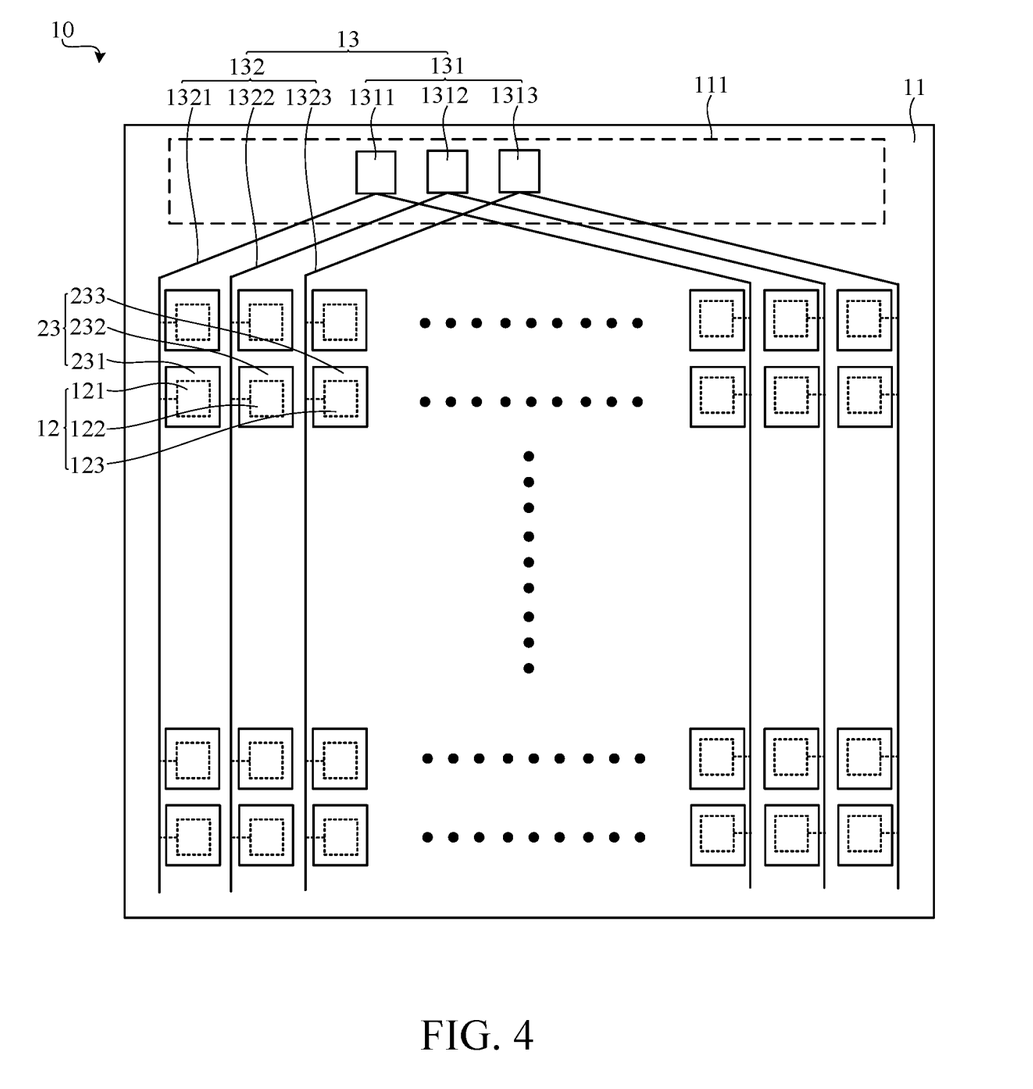
FIG. 4 is a schematic top view of a target base plate in step B3 of the method for transferring an LED shown in FIG. 1.

Referring to FIGS. 2C and 4, in the present embodiment, a same voltage is applied to the first test pad 1311, the second test pad 1312, and the third test pad 1313, to separate the blue film 22 from the to-be-transferred red LED 231, the to-be-transferred green LED 232, and the to-be-transferred blue LED 233.

In detail, the same voltage is applied to the first test pad 1311, the second test pad 1312, and the third test pad 1313 by the external power supply. In the energized state, the to-be-transferred red LED 231, the to-be-transferred green LED 232, and the to-be-transferred blue LED 233 emit light. All of the to-be-transferred red LED, the to-be-transferred green LED, and the to-be-transferred blue LED have the thermal effect in a light emitting state. Therefore, when the thermal effect is conducted to the blue film 22, temperatures at the positions M where the blue film 22 is in contact with the to-be-transferred red LED 231, the to-be-transferred green LED 232, and the to-be-transferred blue LED 233 all increase. The voltage is continuously applied to the test pads 131. With the continuous heating, the temperatures at the positions M where the blue film 22 is in contact with the to-be-transferred red LED 231, the to-be-transferred green LED 232, and the to-be-transferred blue LED 233 continuously increase, until the glue in the blue film 22 denatures and loses the viscosity. Therefore, the to-be-transferred red LED 231, the to-be-transferred green LED 232, and the to-be-transferred blue LED 233 are separated from the blue film 22 due to the elimination of the acting force between the LEDs and the blue film.

It is to be noted that, the top view structures of the to-be-transferred LEDs 23 and the pad sets 12 in FIGS. 3 and 4 in the present embodiment are merely exemplary and are used for description of the present embodiment, and should not be understood as a limitation on the present disclosure.

Figure 2D:
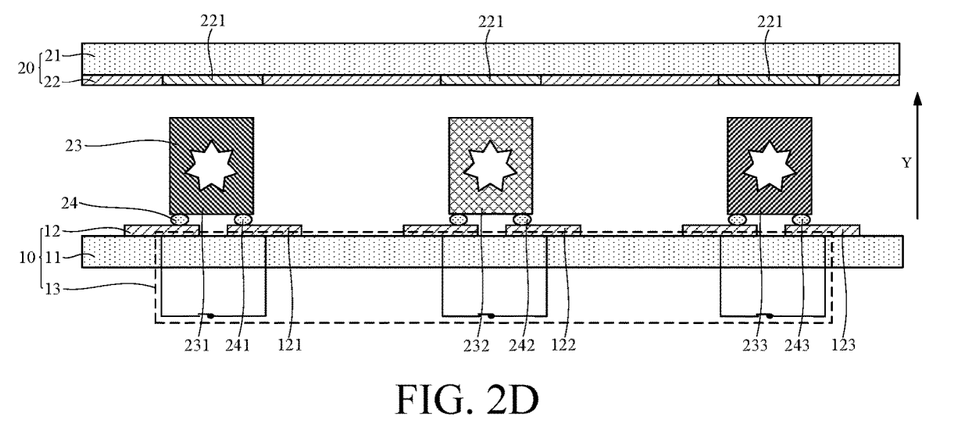

B4: Removing the transfer base plate 20, as shown in FIG. 2D.

In detail, the transfer base plate 20 including the transfer substrate 21 and the blue film 22 is removed.

In the present embodiment, the transfer base plate 20 is moved in a direction Y perpendicular to a plane where the target base plate 10 is located, to avoid an alignment deviation between the to-be-transferred LEDs 23 and the pad sets 12 during separation. Therefore, the alignment accuracy of the LEDs 23 can be improved.

It is to be noted that, in some embodiments, the transfer base plate 20 may be moved in other directions. For example, the transfer base plate 20 may be moved in a direction intersecting the plane where the target base plate 10 is located or in a direction parallel to the transfer base plate 20, which is not described in detail herein.

Figure 2E:
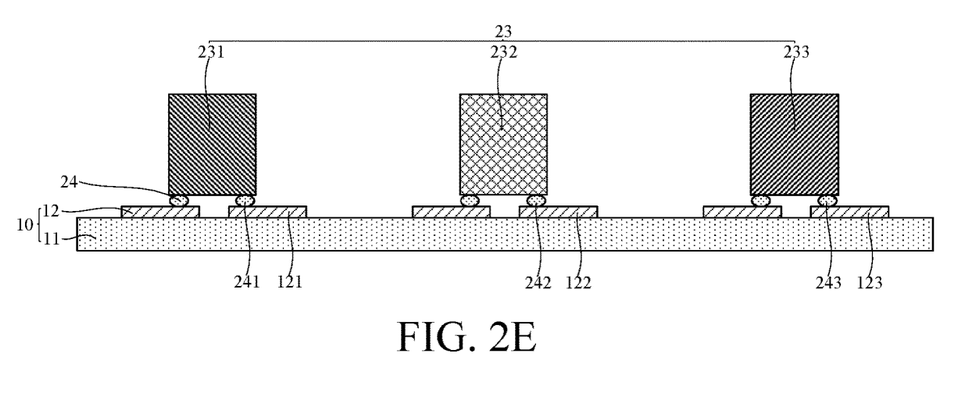

After the step of removing the transfer base plate 20, the method further includes welding the conductive contacts 24 to the corresponding pad sets 12, and removing the conductive circuit 13 to obtain the target base plate 10 having the transferred LED 23, as shown in FIG. 2E.

The conductive contacts 24 are melted by reflow soldering, and the conductive contacts 24 are bonded to the corresponding pad sets 12. In the present embodiment, after the reflow soldering process, the first conductive contact 241 is bonded to the first pad set 121, the second conductive contact 242 is bonded to the second pad set 122, and the third conductive contact 243 is bonded to the third pad set 123. Therefore, the transfer of the red LED 231, the green LED 232, and the blue LED 233 is completed.

It may be understood that, when the to-be-transferred LEDs 23 are disconnected or damaged, that is, the to-be-transferred LEDs are faulty, the to-be-transferred LED 23 cannot be conducted in the energized state. Therefore, the LEDs neither emit light nor generate heat.

Figure 5A:
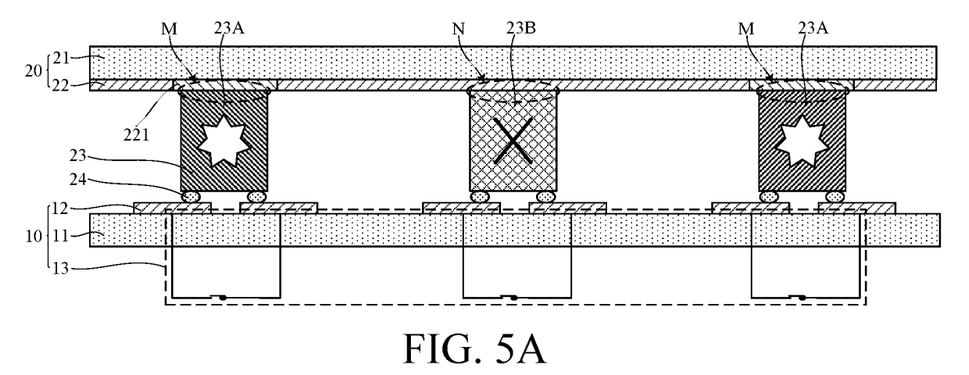
FIGS. 5A and 5B are schematic diagrams of a process and a structure in the method for transferring an LED shown in FIG. 1 without lightless LEDs.

Referring to FIG. 5A, when there is a lightless to-be-transferred LED 23B, in step B3, after the plurality of to-be-transferred LEDs 23 are energized, a lighted to-be-transferred LED 23A is separated from the blue film 22, and the lightless to-be-transferred LED 23B is still connected to the blue film 22. In this case, a temperature at a position M where the blue film 22 is in contact with the lighted to-be-transferred LED 23A increases, until a portion 221 where the blue film 22 is in contact with the lighted to-be-transferred LED 23A loses viscosity to achieve separation. Since a temperature at a position N where the blue film 22 is in contact with the lightless to-be-transferred LED 23B does not change, the blue film 22 is still connected to the lightless to-be-transferred LED 23B.

Figure 5B:
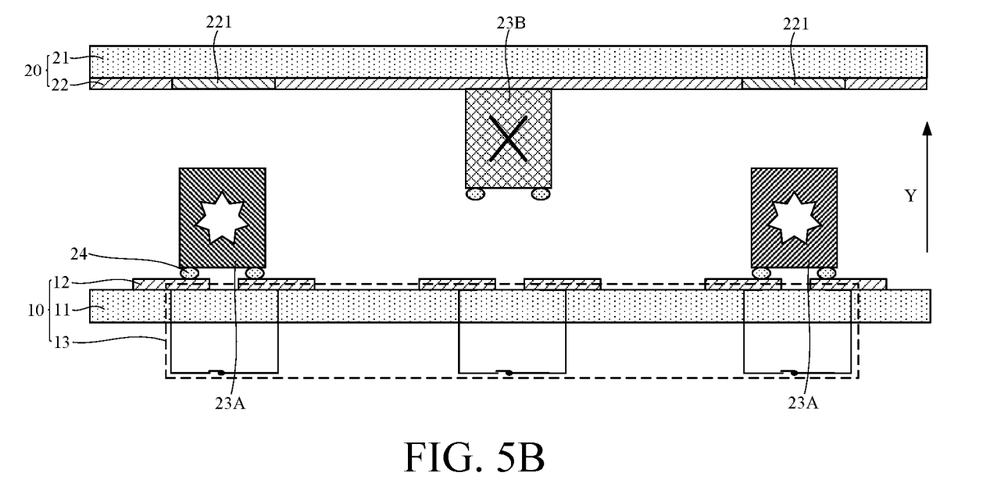

Referring to FIG. 5B, in step B4, the transfer base plate 20 including the transfer substrate 21, the blue film 22, and the lightless to-be-transferred LED 23B is removed. In detail, after the transfer base plate 20 is moved in the direction Y perpendicular to the plane where the target base plate 10 is located, the lighted to-be-transferred LED 23A is transferred to the target base plate 10, and the lightless to-be-transferred LED 23B is removed with the blue film 22.

Therefore, in the present embodiment, by determining the light emitting states of the LEDs 23 transferred to the target base plate 10, the lightless to-be-transferred LED 23B (the faulty LED) can be identified, and during the removal of the transfer base plate 20, the faulty LED can be directly removed with the blue film 22. Therefore, an additional separation device for the faulty LED is not required, thereby reducing the technical difficulty and the process costs. In addition, compared with the conventional process of transferring the LEDs and then identifying and separating the faulty LED, in the present embodiment, the identification and the separation of the faulty LED can be achieved during the transfer of the LEDs 23. Therefore, the transfer efficiency of the LEDs 23 can be greatly enhanced.

Further, during the removal of the transfer base plate 20, the LEDs 23 transferred to the target base plate 10 are in a lighted state, that is, the LEDs 23 on the target base plate 10 all can emit light normally. All of the LEDs 23 that can emit light normally form a lighted pattern on the target base plate 10. Therefore, a faulty position (a position corresponding to the faulty LED) on the target base plate 10 can be directly found using the lighted pattern. In this way, when a new LED is required to be filled, the new LED may be directly transferred to the above faulty position in a point-to-point manner. Therefore, a special process of determining the faulty position is not required, thereby greatly reducing the technical difficulty and the process costs.

To sum up, in the present embodiment, during the transfer of the LEDs 23, the thermal effect generated during the emission of the LEDs 23 causes the blue film 22 to loses the viscosity, so that the blue film is separated from the LEDs 23 to realize the transfer of the LEDs 23. The method for transferring an LED 23 provided in the present embodiment has the following advantages.

1. Compared with a conventional laser transfer technology, in the present embodiment, since laser irradiation is omitted, the risk of performance degradation of the LEDs 23 caused by laser irradiation can be reduced. In addition, compared with a manner of ablating the blue film 22 by a laser to separate the LEDs 23 for transfer, in the present embodiment, since the transfer is achieved by the thermal effect of the LEDs 23, the LEDs 23 are free of damage.

2. Compared with a conventional transfer technology using a die bonder and a needle die bonder, in the present embodiment, since the LEDs 23 can be directly separated from the blue film 22 during the removal of the transfer base plate 20, there is no alignment deviation during the separation of the LED 23, and therefore there is no poor transfer accuracy. Desirable transfer accuracy can be guaranteed by means of the alignment between the LEDs 23 and the pad sets 12. In addition, in the present embodiment, since all of the LEDs 23 on the blue film 22 can be simultaneously separated from the blue film 22, the transfer of all of the LEDs 23 can be completed at one time. Therefore, the transfer rate can be greatly increased. Therefore, the method for transferring an LED 23 in the present embodiment has high transfer accuracy and a high transfer rate, which can meet the requirements of the mass transfer of the LEDs 23.

3. Compared with a conventional seal transfer method, in the present embodiment, the transfer of the LEDs 23 can be realized only using the original test pads 131 and test traces 132 on the target base plate 10 without additional instruments and devices. Therefore, the process costs can be greatly reduced.

4. In the present embodiment, the faulty LED can be identified and separated during the transfer of the LEDs 23 according to the light emitting states of the LEDs 23 in the energized state. Since the additional separation device for the faulty LED is not required, both the technical difficulty and the process costs can be reduced.

5. In the present embodiment, for determination of the faulty position of the faulty LED on the target base plate 10, when a new LED 23 is required to be filled, the faulty position may be directly found using the lighted pattern of the LEDs 23 on the target base plate 10 without additional instruments and devices. Therefore, in the present embodiment, the faulty position can be determined during the transfer of the LEDs 23. Since the faulty position can be easily found according to the lighted pattern, both the process costs and the difficulty in determining the faulty position can be reduced.

A second embodiment of the present disclosure provides a method for transferring an LED. A difference between the method for transferring an LED provided in the second embodiment and the method for transferring an LED provided in the first embodiment lies in the following: In step B3, the step of applying the voltage to the test pads 131 includes applying a first voltage V1 to the first test pad 1311, applying a second voltage V2 to the second test pad 1312, and applying a third voltage V3 to the third test pad 1313, wherein V1<V2<V3.

Since the red LED 231, the green LED 232, and the blue LED 233 have different heating efficiency, that is, the red LED 231, the green LED 232, and the blue LED 233 have different current requirements for light emission, different voltages are required to be applied to the red LED, the green LED, and the blue LED for light emission. In detail, the heating efficiency decrements from the red LED 231, the green LED 232, to the blue LED 233.

In the present embodiment, by applying the first voltage V1 to the red LED 231, the second voltage V2 to the green LED 232, and the third voltage V3 to the blue LED 233, wherein V1<V2<V3, the red LED 231, the green LED 232, and the blue LED 233 can emit light within a same time period. Therefore, different rates of separation from the blue film 22 caused by different heating efficiency of the red LED, the green LED, and the blue LED can be avoided. In this way, the transfer rates of the LEDs 23 can be further increased.

Figure 6:
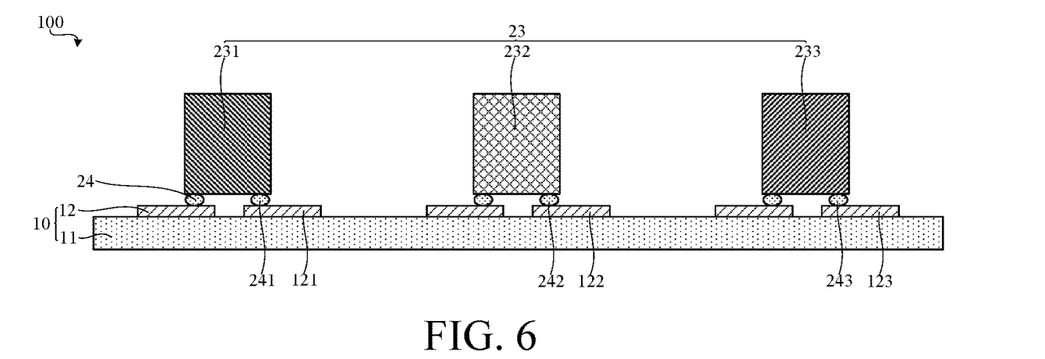
FIG. 6 is a schematic diagram of a structure of a light-emitting base plate according to the present disclosure.

Referring to FIG. 6, the present disclosure further provides a light-emitting base plate 100. The light-emitting base plate 100 includes a target base plate 10 and a plurality of LEDs 23. The target base plate 10 includes a target substrate 11 and a plurality of pad sets 12 disposed on the target substrate 11. The plurality of LEDs 23 are connected to the plurality of pad sets 12 in a one-to-one correspondence. Conductive contacts 24 are connected between the LEDs 23 and the pad sets 12.

The pad sets 12 include a first pad set 121, a second pad set 122, and a third pad set 123. The LEDs 23 include a red LED 231, a green LED 232, and a blue LED 233. The conductive contacts 24 include a first conductive contact 241, a second conductive contact 242, and a third conductive contact 243. The red LED 231 is connected to the first pad set 121 using the first conductive contact 241. The green LED 232 is connected to the second pad set 122 using the second conductive contact 242. The blue LED 233 is connected to the third pad set 123 using the third conductive contact 243.

The LEDs 23 may be obtained using the method for transferring an LED 23 described in any of the above embodiments. For the related transfer method, reference may be made to the description of the above embodiments, which is not repeated herein.

Figure 7:
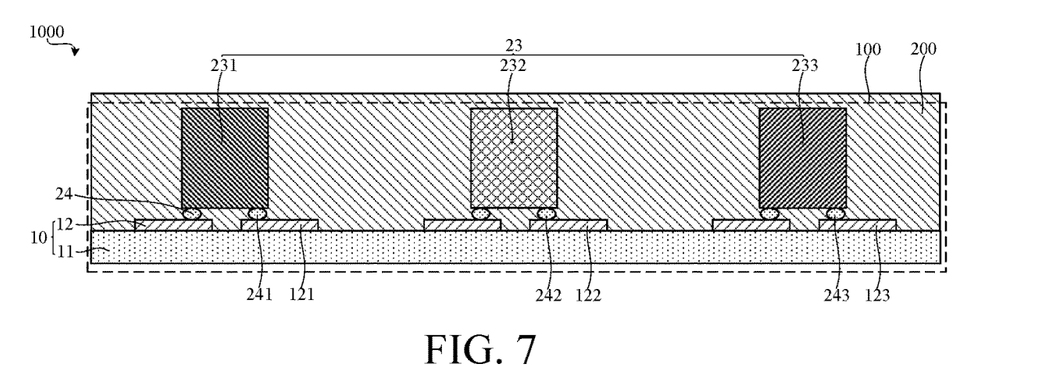
FIG. 7 is a schematic diagram of a structure of a display panel according to the present disclosure.

Referring to FIG. 7, the embodiment of the present disclosure further provides a display panel 1000. The display panel 1000 includes a light-emitting base plate 100 and a packaging layer 200 disposed on the light-emitting base plate 100. The light-emitting base plate 100 may be the light-emitting base plate 100 described in the above embodiments. For a detailed structure of the light-emitting base plate 100, reference may be made to the description of the above embodiments, which is not repeated herein.

A method for transferring a light-emitting diode (LED) and a light-emitting base plate provided in the embodiments of the present disclosure are described above in detail. Although the principles and implementations of the present disclosure are described by using specific examples in this specification, the descriptions of the foregoing embodiments are only intended to help understand the method and the core idea of the present disclosure. Meanwhile, a person skilled in the art may make modifications to the specific implementations and an application range according to the idea of the present disclosure. In conclusion, the content of this specification is not to be construed as a limitation to the present disclosure.

What is claimed is:

1. A method for transferring a light-emitting diode (LED), comprising following steps of:
   providing a target base plate and a transfer base plate, wherein the target base plate comprises a target substrate, and a plurality of pad sets and a conductive circuit disposed on the target substrate; wherein the conductive circuit comprises test pads and test traces, the test pads are located in a peripheral area of the target substrate, and the pad sets are connected to the test pads using the test traces; and the transfer base plate comprises a transfer substrate and a blue film disposed on the transfer substrate, wherein a plurality of to-be-transferred LEDs are connected to the blue film;
   connecting the to-be-transferred LEDs to the pad sets in alignment;
   energizing the plurality of to-be-transferred LEDs to separate the blue film from the to-be-transferred LEDs; and
   removing the transfer base plate;
   wherein the step of energizing the plurality of to-be-transferred LEDs comprises:
   applying a voltage to the test pads, to cause the LEDs to emit light.

2. The method for transferring an LED as claimed in claim 1, wherein the to-be-transferred LEDs comprise a to-be-transferred red LED, a to-be-transferred green LED, and a to-be-transferred blue LED, the pad sets comprise a first pad set, a second pad set, and a third pad set, the test pads comprise a first test pad, a second test pad, and a third test pad, and the test traces comprise a first test trace, a second test trace, and a third test trace, wherein the first pad set is connected to the first test pad using the first test trace, the second pad set is connected to the second test pad using the second test trace, and the third pad set is connected to the third test pad using the third test trace;
   the step of connecting the to-be-transferred LEDs to the pad sets in alignment comprises: connecting the to-be-transferred red LED to the first pad set in alignment, connecting the to-be-transferred green LED to the second pad set in alignment, and connecting the to-be-transferred blue LED to the third pad set in alignment; and
   the step of applying the voltage to the test pads comprises: applying a same voltage to the first test pad, the second test pad, and the third test pad to separate the blue film from the to-be-transferred red LED, the to-be-transferred green LED, and the to-be-transferred blue LED.

3. The method for transferring an LED as claimed in claim 1, wherein the to-be-transferred LEDs comprise a to-be-transferred red LED, a to-be-transferred green LED, and a to-be-transferred blue LED, the pad sets comprise a first pad set, a second pad set, and a third pad set, the test pads comprise a first test pad, a second test pad, and a third test pad, and the test traces comprise a first test trace, a second test trace, and a third test trace, wherein the first pad set is connected to the first test pad using the first test trace, the second pad set is connected to the second test pad using the second test trace, and the third pad set is connected to the third test pad using the third test trace;
the step of connecting the to-be-transferred LEDs to the pad sets in alignment comprises: connecting the to-be-transferred red LED to the first pad set in alignment, connecting the to-be-transferred green LED to the second pad set in alignment, and connecting the to-be-transferred blue LED to the third pad set in alignment; and
the step of applying the voltage to the test pads comprises: applying a first voltage V1 to the first test pad, applying a second voltage V2 to the second test pad, and applying a third voltage V3 to the third test pad, wherein V1<V2<V3.

4. The method for transferring an LED as claimed in claim 1, wherein the step of removing the transfer base plate comprises: moving the transfer base plate in a direction perpendicular to a plane where the target base plate is located.

5. The method for transferring an LED as claimed in claim 1, wherein after the plurality of to-be-transferred LEDs are energized, the lighted to-be-transferred LEDs are separated from the blue film; and
the step of removing the transfer base plate comprises: removing the transfer base plate comprising the transfer substrate and the blue film.

6. The method for transferring an LED as claimed in claim 1, wherein after the plurality of to-be-transferred LEDs are energized, the lighted to-be-transferred LEDs are separated from the blue film, and the lightless to-be-transferred LEDs are connected to the blue film; and
the step of removing the transfer base plate comprises: removing the transfer base plate comprising the transfer substrate, the blue film, and the lightless to-be-transferred LEDs.

7. The method for transferring an LED as claimed in claim 1, wherein in the step of providing the transfer base plate and the target base plate, conductive contacts are connected to the to-be-transferred LEDs; and
after the step of removing the transfer base plate, the method further comprises: welding the conductive contacts to the corresponding pad sets.

8. A light-emitting base plate, comprising:
a target base plate comprising a target substrate and a plurality of pad sets disposed on the target substrate; and
a plurality of light-emitting diodes (LEDs) connected to the plurality of pad sets in a one-to-one correspondence, wherein the LEDs are obtained using the method for transferring an LED as claimed in claim 1.

9. The method for transferring an LED as claimed in claim 1, wherein the step of removing the transfer base plate comprises: moving the transfer base plate in a direction intersecting a plane where the target base plate is located or in a direction parallel to the transfer base plate.

10. The method for transferring an LED as claimed in claim 1, wherein the to-be-transferred LEDs are connected to a plurality of conductive contacts; and
wherein after the step of removing the transfer base plate, the method further comprises:
welding the conductive contacts to the corresponding pad sets, and
removing the conductive circuit.

11. The method for transferring an LED as claimed in claim 1, wherein the to-be-transferred LEDs are connected to a plurality of conductive contacts, and wherein a material of the conductive contacts comprises one or more of tin, indium, lead, and bismuth.

12. The method for transferring an LED as claimed in claim 1, wherein the transfer substrate is a sapphire substrate, a gallium arsenide substrate, a silicon substrate, or a quartz glass.

13. A method for transferring a light-emitting diode (LED), comprising steps of:
providing a target base plate and a transfer base plate, wherein the target base plate comprises a target substrate, and a plurality of pad sets and a conductive circuit disposed on the target substrate; wherein the conductive circuit comprises test pads and test traces, the test pads are located in a peripheral area of the target substrate, and the pad sets are connected to the test pads using the test traces; and the transfer base plate comprises a transfer substrate and a blue film disposed on the transfer substrate, wherein a plurality of to-be-transferred LEDs are connected to the blue film, and conductive contacts are connected to the to-be-transferred LEDs;
connecting the to-be-transferred LEDs to the pad sets in alignment;
energizing the plurality of to-be-transferred LEDs to separate the blue film from the to-be-transferred LEDs;
moving the transfer base plate in a direction perpendicular to a plane where the target base plate is located; and
welding the conductive contacts to the corresponding pad sets;
wherein the step of energizing the plurality of to-be-transferred LEDs comprises: applying a voltage to the test pads, to cause the LEDs to emit light.

14. The method for transferring an LED as claimed in claim 13, wherein after the step of removing the transfer base plate, the method further comprises:
welding the conductive contacts to the corresponding pad sets, and
removing the conductive circuit.

15. The method for transferring an LED as claimed in claim 13, wherein the to-be-transferred LEDs comprise a to-be-transferred red LED, a to-be-transferred green LED, and a to-be-transferred blue LED, the pad sets comprise a first pad set, a second pad set, and a third pad set, the test pads comprise a first test pad, a second test pad, and a third test pad, and the test traces comprise a first test trace, a second test trace, and a third test trace, the first pad set is connected to the first test pad using the first test trace, the second pad set is connected to the second test pad using the second test trace, and the third pad set is connected to the third test pad using the third test trace;
the step of connecting the to-be-transferred LEDs to the pad sets in alignment comprises:
connecting the to-be-transferred red LED to the first pad set in alignment, connecting the to-be-transferred green LED to the second pad set in alignment, and connecting the to-be-transferred blue LED to the third pad set in alignment; and the step of applying the voltage to the test pads comprises:
applying a same voltage to the first test pad, the second test pad, and the third test pad to separate the blue film from the to-be-transferred red LED, the to-be-transferred green LED, and the to-be-transferred blue LED.

16. The method for transferring an LED as claimed in claim 13, wherein the to-be-transferred LEDs comprise a to-be-transferred red LED, a to-be-transferred green LED, and a to-be-transferred blue LED, the pad sets comprise a first pad set, a second pad set, and a third pad set, the test pads comprise a first test pad, a second test pad, and a third test pad, and the test traces comprise a first test trace, a second test trace, and a third test trace, the first pad set is connected to the first test pad using the first test trace, the second pad set is connected to the second test pad using the second test trace, and the third pad set is connected to the third test pad using the third test trace;

the step of connecting the to-be-transferred LEDs to the pad sets in alignment comprises:
connecting the to-be-transferred red LED to the first pad set in alignment, connecting the to-be-transferred green LED to the second pad set in alignment, and connecting the to-be-transferred blue LED to the third pad set in alignment;

the step of applying the voltage to the test pads comprises:
applying a first voltage V1 to the first test pad, applying a second voltage V2 to the second test pad, and applying a third voltage V3 to the third test pad, wherein V1<V2<V3.

17. The method for transferring an LED as claimed in claim 13, wherein after the plurality of to-be-transferred LEDs are energized, the lighted to-be-transferred LEDs are separated from the blue film; and the step of removing the transfer base plate comprises:
removing the transfer base plate comprising the transfer substrate and the blue film.

18. The method for transferring an LED as claimed in claim 13, wherein after the plurality of to-be-transferred LEDs are energized, the lighted to-be-transferred LEDs are separated from the blue film, and the lightless to-be-transferred LEDs are connected to the blue film; and the step of removing the transfer base plate comprises:
removing the transferring base plate comprising the transferring substrate, the blue film, and the lightless to-be-transferred LEDs.

19. The method for transferring an LED as claimed in claim 13, wherein a material of the conductive contacts comprises one or more of tin, indium, lead, and bismuth.

20. The method for transferring an LED as claimed in claim 13, wherein the transfer substrate is a sapphire substrate, a gallium arsenide substrate, a silicon substrate, or a quartz glass.

* * * * *